United States Patent [19]

Basol et al.

[11] Patent Number: 4,595,791
[45] Date of Patent: Jun. 17, 1986

[54] THIN-FILM PHOTOVOLTAIC DEVICES INCORPORATING CURRENT COLLECTOR GRID AND METHOD OF MAKING

[75] Inventors: Bulent M. Basol, Los Angeles; Eric S. Tseng, Torrance, both of Calif.; William J. Biter, Hudson, Ohio

[73] Assignee: The Standard Oil Company, Cleveland, Ohio

[21] Appl. No.: 696,149

[22] Filed: Jan. 29, 1985

[51] Int. Cl.[4] .................. H01L 31/06; H01L 31/18
[52] U.S. Cl. .................... 136/256; 29/572; 29/591; 427/74; 427/76; 427/88; 427/91; 204/2.1; 204/40; 357/30; 357/65; 136/260
[58] Field of Search .............. 136/256, 260, 264; 29/572, 589, 591; 427/74–76, 86–88, 91; 204/2.1, 40; 357/30, 65, 68, 71

[56] References Cited

U.S. PATENT DOCUMENTS

| | | |
|---|---|---|
| 3,431,150 | 3/1969 | Dolan, Jr. et al. .................. 148/1.5 |
| 4,143,235 | 3/1979 | Duisman . | |
| 4,159,914 | 7/1979 | Jordan et al. .................. 136/258 PC |
| 4,400,244 | 8/1983 | Kroger et al. .................. 204/2.1 |
| 4,542,255 | 9/1985 | Tanner et al. .................. 136/249 MS |

FOREIGN PATENT DOCUMENTS 58-119677  7/1983  Japan .................. 136/256

Primary Examiner—Aaron Weisstuch
Attorney, Agent, or Firm—Thomas P. Schur; Joseph G. Curatolo; Larry W. Evans

[57] ABSTRACT

A stable front contact current collector grid 116 is provided for photovoltaic devices. The current collector grid 116 is disposed between two semiconductor layers, 118 and 119, each semiconductor layer having the same conductivity type. The photovoltaic device utilizes a substrate 112; an optically transparent electrically conductive layer 114; a first layer of semiconductor material 118; a front contact current collector grid 116; a second layer of semiconductor material 119 having the same conductivity type as the first semiconductor layer; a third layer of semiconductor material 120 having a conductivity type opposite from that of the first and second semiconductor layers; and an electrically conductive film 122 in contact with the third semiconductor layer.

29 Claims, 2 Drawing Figures

THIN-FILM PHOTOVOLTAIC DEVICES INCORPORATING CURRENT COLLECTOR GRID AND METHOD OF MAKING

FIELD OF THE INVENTION

This invention relates to a method for forming a front contact current collector grid for a photovoltaic device. More specifically, the invention relates to a method of forming a stable front contact current collector grid for a thin-film photovoltaic device prior to the formation of the active semiconductor layers.

BACKGROUND OF THE INVENTION

Photovoltaic devices utilize specific conductivity characteristics of materials generally referred to as semiconductors, whereby solar energy or radiation is converted to useful electrical energy. This conversion results from the absorption of photon energy in the active region of the cell, whereby some of the absorbed energy causes the generation of electron-hole pairs. The energy required for the generation of electron-hole pairs in a semiconductor material is referred to as the band gap energy and generally is the minimum energy required to excite an electron from the valence band to the conduction band.

There are two principal measures of the utility of photovoltaic devices. First is the efficiency of the device, which is an ascertainable percentage of the total photon energy converted to useful electrical energy. High efficiency photovoltaic devices made of crystalline materials maximize efficiency by minimizing internal lattice defects which can cause internal shorts and boundary defects, thereby reducing the conductivity and recombination characteristics of the devices. The second measure of the utility of a photovoltaic device is its cost. Single crystal devices are complex and costly to produce, and do not readily lend themselves to high volume production.

One approach to reducing the cost of photovoltaic devices is to utilize polycrystalline materials and a heterojunction. A heterojunction refers to the active junction formed at the interface between two or more dissimilar materials, such as cadmium sulfide and cadmium telluride, as taught by Basol, et al. in U.S. Pat. No. 4,388,483. Basol, et al. describe thin-film photovoltaic cells wherein the active layer comprises at least one of the metal elements of Group IIB of the Periodic Table of Elements and one of the non-metal elements of Group VIA of the Periodic Table of Elements. One feature of such photovoltaic devices is the use of extremely thin active layers. As an example, Basol, et al. utilized a cadmium sulfide layer on the order of 0.02-0.05 micrometer thick and a cadmium telluride layer on the order of about 1.3 micrometers thick. While such economy of material has obvious advantages, it has also presented an unexpected concern with respect to current collection.

Such thin-film photovoltaic devices typically comprise an optically transparent substrate, a first semiconductor layer formed on the transparent substrate, a second semiconductor layer of opposite conductivity type from the first semiconductor layer and forming a junction with the first layer, and a back contact comprised of a conductive film. When the substrate is not electrically conductive, a transparent electrically conductive front contact is disposed between the substrate and the first semiconductor layer; the front contact generally being a layer of a transparent conductive oxide. This layer functions as a current collector for the photovoltaic device. Transparent conductive oxides, such as indium tin oxide, indium oxide, zinc oxide, and tin oxide however, are not efficient current collectors in cells of any appreciable size, that is, greater than about one square centimeter, due to their inherent resistivity which is on the order of about 10 ohms per square at thicknesses necessary for good optical transmission. The transparent conductive layer must be supplemented with more efficient current collection means such as a front contact current collector grid. Formation of a front contact current collector grid for thin-film photovoltaic devices presents novel concerns as the general thickness of a front contact grid-type current collector disposed in contact with the transparent conductive layer typically exceeds the thickness of the first active semiconductor layer and extends into the second active semiconductor layer. This geometry creates problems with respect to shorting of the device and to uniform formation of the semiconductor layers themselves.

Generally, a front contact current collector grid is deposited onto a transparent conductive layer and followed by subsequent depositions of the active semiconductor layers. This procedure has several drawbacks when applied to the formation of a front contact current collector grid for a photovoltaic device when the thickness of the grid exceeds the thickness of the first semiconductor layer.

A first concern relates to diffusion of the grid material into the semiconductor layers. If subsequent process steps for the formation of the semiconductor layers include treatments at elevated temperatures that encourage diffusion, or if the semiconductor layers are electrodeposited in a bath that may dissolve the grid material, then the grid and the semiconductor layers may be adversely affected. In the latter instance, the grid may be deteriorated and the bath may become contaminated with leached grid material, which then appears in the deposited semiconductor layer.

A second concern arises with regard to the deposition of semiconductor layers subsequent to the formation of the current collector grid. The deposition may not be uniform or complete due to the presence of the current collector grid, which has a relatively large thickness. It has been seen that the electrodeposition of semiconductor materials near such a grid is imperfect, often leaving exposed portions of the transparent conductive layer which may become eroded. Under such circumstances, the grid is insulated from the semiconductor layers and cannot be an effective current collector. This has the adverse result of increasing the series resistance of the photovoltaic device, and may ultimately cause failure of such a device.

What is needed in the area of efficient current collection in photovoltaic devices is a stable front contact current collection grid not suffering from the above-described deficiencies.

It is therefore one object of the present invention to provide a front contact current collector grid for photovoltaic devices, which current collector grid is not accompanied by the above-identified shortcomings.

It is another object of the present invention to provide a photovoltaic device having a stable, front contact current collector grid incorporated therein.

It is yet another object of the present invention to provide a method for the formation of a photovoltaic device that has a stable front contact current collector grid incorporated therein.

These and additional objects of the present invention will become apparent to one skilled in the art from the below description of the invention and the appended claims.

SUMMARY OF THE INVENTION

The present invention relates to a front contact current collector grid for a photovoltaic device comprising a first semiconductor layer of one conductivity type, a second semiconductor layer having the same type conductivity as the first layer and a third semiconductor layer having a conductivity type opposite from the conductivity of the first and second layers and forming a junction with the second layer, the front contact current collector grid being disposed between the first semiconductor layer and the second semiconductor layer.

The invention further relates to a photovoltaic device comprising an optically transparent substrate, a first semiconductor layer formed on the substrate, a current collector grid in ohmic contact with the first semiconductor layer and deposited thereon, a second semiconductor layer having the same conductivity type as the first semiconductor layer and deposited onto the exposed first semiconductor layer and current collector grid, a third semiconductor layer of conductivity type opposite from that of the first and second semiconductor layers and forming a junction with the second layer, and an electrically conductive film disposed on the third semiconductor layer to form an electrical contact therewith.

The invention also relates to a process for forming a photovoltaic device, which process comprises:

(a) depositing a first semiconductor layer onto an optically transparent substrate;

(b) selectively depositing an electrically conductive material onto the first semiconductor layer to form a current collector grid thereon;

(c) depositing a second semiconductor layer having the same conductivity type as the first semiconductor layer on the exposed first semiconductor layer and current collector grid;

(d) depositing a third semiconductor layer having a conductivity type opposite from the conductivity type of the first and second semiconductor layers onto the second semiconductor layer so as to form a junction with the second layer; and (e) depositing an electrically conductive material onto the third semiconductor layer so as to form an electrical contact therewith.

Preferably, the photovoltaic devices in accordance with the present invention also include a layer of an optically transparent electrically conductive material disposed between the substrate and the first semiconductor layer.

DETAILED DESCRIPTION OF THE INVENTION

As used herein, reference is made to large-area, thin-film photovoltaic devices. Such photovoltaic devices are characterized in having an exposed active surface area of at least one square centimeter, combined semiconductor layer thicknesses of less than about two micrometers, and comprising semiconductor layers of opposite conductivity types. Examples of such semiconductor layer combinations include CdTe/CdS, HgCdTe/CdS, $Cu_2S$/CdS, $CuInSe_2$/CdS, ZnTe/CdS, and ZnTe/CdSe. Preferably, the semiconductor layer combinations include individual layers wherein each layer comprises at least one of the metal elements of Group IIB of the Periodic Table of Elements and one of the non-metal elements of Group VIA of the Periodic Table of Elements, such as CdS, CdTe, and HgCdTe.

The front contact current collector grid comprises at least one layer of an electrically conductive material selected from the group consisting of copper, gold, silver, nickel, and, as described in copending patent application U.S. Ser. No. 687,079, aluminum, indium, cadmium, tin, lead, zinc, and mixtures and alloys thereof, as well as mixtures and alloys of any of the above. Preferably a front contact current collector grid of this invention comprises at least one layer of a material selected from the group consisting of copper, gold, silver, nickel, aluminum, and mixtures and alloys thereof. Most preferably the current collector grid of this invention is of copper.

While the invention will be described below as utilizing cadmium sulfide and cadmium telluride semiconductor layers, such embodiment is not to be regarded as limitative. The invention can be utilized in any semiconductor device wherein a current collector grid is incorporated as a front contact.

U.S. Pat. No. 4,388,483 to Basol, et al. incorporated herein by reference, teaches a thin-film photovoltaic device having an n-type semiconductor layer of cadmium sulfide and a p-type semiconductor layer of cadmium telluride. Light enters such a cell through a transparent substrate and passes therethrough into a cadmium sulfide layer, then into a cadmium telluride layer. Since the cadmium sulfide layer attenuates light reaching the cadmium sulfide/cadmium telluride heterojunction, it is desirable to provide a very thin cadmium sulfide layer, in the range of from about 0.01 micrometer to about 0.1 micrometer in thickness. The cadmium telluride layer is an efficient absorber of light and does not require a thickness of more than about 1.2 micrometers to effectively utilize about all of the usable solar spectra which enters. Increased cadmium sulfide and cadmium telluride layer thicknesses only serve to increase the series resistance of the cell, and so decrease the cell's overall efficiency.

The cadmium sulfide layer is generally contiguous to a layer of an optically transparent, electrically conductive material such as indium tin oxide that is disposed between the cadmium sulfide layer and the transparent substrate. To enhance the current collection of the indium tin oxide layer, a current collector grid is utilized. This front contact current collector grid may have any geometry that allows efficient current collection. Preferably the grid comprises narrow strips so as to permit the maximum amount of solar radiation to enter the cell. Because the grid is narrow, each strip has a relatively large thickness so that the grid has a low resistivity compared to the conductive, transparent layer. The typical thickness of such a grid is generally from about 2 micrometers to about 10 micrometers, depending on the material used for the grid.

However, as has been described above in the Background of the Invention, the formation of a front contact current collector grid on a layer of a transparent conductive material followed by subsequent deposition of active semiconductor layers has certain inherent disadvantages; incomplete deposition of semiconductor layers due to the current collector grid geometry, diffusion of current collector grid material into semiconductor material, and exposure of the transparent conductive layer to subsequent process steps which in electrodeposition processes may erode this layer. All of these disadvantages can prevent the photovoltaic device from performing efficiently, if at all.

In accordance with the present invention, some of the above-described concerns are eliminated by disposing a layer of semiconductor material over the transparent conductive layer before the deposition of the front contact current collector. In this way, the transparent conductive layer is completely covered with semiconducting material that withstands subsequent processing steps and which protects the transparent conductive layer from acidic deposition baths and etching solutions. Although subsequent processing steps may suffer from similar deficiencies found in known processing steps, that is, incomplete deposition of subsequent semiconductor layers and some doping of the semiconductor layer from the current collector strip during heat treatment, the major disadvantages of erosion of the transparent conductive layer and isolation of the current collector grid will not occur.

The subject invention utilizes a substrate, a first layer of semiconductor material, a front contact current collector grid, a second layer of semiconductor material having the same conductivity type as the first semiconductor layer, a third layer of semiconductor material having a conductivity type opposite from that of the first and second semiconductor layers, and an electrically conductive film in contact with the third semiconductor layer. A layer of an insulating material may be disposed between the current collector grid and the electrically conductive film in contact with the third semiconductor layer. A layer of an optically transparent electrically conductive material may also be incorporated between the substrate and the first semiconductor layer.

In a preferred embodiment of the subject invention, the first and second semiconductor layers, having the same type conductivities, comprise the same semiconductor material. The thickness of the first and second semiconductor layers is approximately equal to the typical thickness of a semiconductor layer having the same conductivity type utilized in prior cell designs.

The ratio of thicknesses between the first and second semiconductor layers of the present invention, each having the same conductivity type, may range from about 1:9 to about 9:1. More preferably, the range of thicknesses between the first and second semiconductor layers of the photovoltaic device in accordance with the present invention is from about 2:3 to about 3:2, and most preferably about 1:1.

The following drawings and examples demonstrate the effectiveness of the subject invention. It is to be understood that these drawings and examples are utilized for illustrative purposes only, and are not intended in any way, to be limitative of the present invention.

DETAILED DESCRIPTION OF THE DRAWINGS

Figure 1:
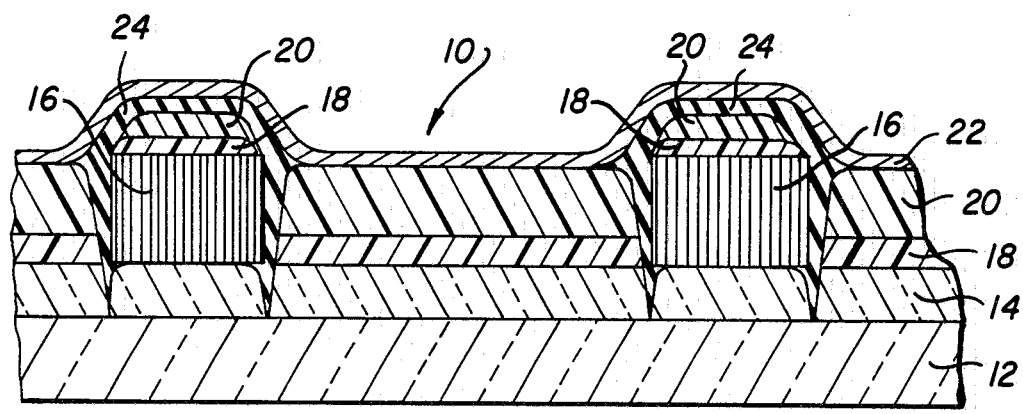
FIG. 1 is a cross-sectional view of a photovoltaic device suffering from the disadvantages of known electrodeposition processes when a front contact current collector grid is incorporated therein.

As shown in FIG. 1, a photovoltaic device in accordance with known art and which utilizes a front contact current collector grid incorporated therein, shown generally by reference 10, comprises a transparent substrate 12, such as glass, through which radiant energy may enter the device. A layer of an optically transparent electrically conductive material 14 is shown deposited onto the substrate 12 and is contiguous thereto. A front contact current collector grid 16 is shown in touching contact with the transparent conductive layer 14. In accordance with known electrodeposition art, a first semiconductor layer 18 is disposed on the transparent conductive layer 14 and the current collector 16 and a second semiconductor layer 20 is disposed on the first semiconductor layer 18. The conductivity types of semiconductor layers 18 and 20 are not the same. As an example, the first semiconductor layer 18 may be an n-type semiconductor layer of cadmium sulfide and the second semiconductor layer 20 may be a p-type semiconductor layer of cadmium telluride. The thickness of the current collector grid 16 is shown to exceed the thickness of the first semiconductor layer 18. A layer of an electrically insulating material 24 is disposed around the current collector grid 16. A back contact current collector 22 is deposited in touching contact with the second semiconductor layer 20.

It is to be noted herein, and appreciated by those skilled in the art, that the dimensions of the various features of the figures depicted herein are not drawn to scale with respect to each individual feature. A typical thin-film photovoltaic device may contain active semiconductor layers having combined thicknesses in the range of from about 1 micrometer to about 10 micrometers, and utilize a front contact current collector grid having a thickness of from about 1 micrometer to about 10 micrometers. It is appreciated that the features in the drawings are depicted for the purpose of clarifying the subject invention.

As shown in FIG. 1, if the semiconductor layers are deposited by electrodeposition, as in accordance with U.S. Pat. No. 4,388,438 to Basol et al., the first and second semiconductor layers may not be deposited completely along the edges of the gridlines, thereby exposing the transparent conductive layer. Subsequent electrodeposition processing steps such as acidic deposition baths and etching solutions may undercut the transparent conductive layer 14, eroding it and preventing any subsequent electrodeposition of semiconductor layers thereon. The front contact current collector grid strips 16 then are essentially insulated from the active semiconducting regions. The overall effectiveness of the photovoltaic device is greatly diminished and ultimate failure of the device would be likely.

Figure 2:
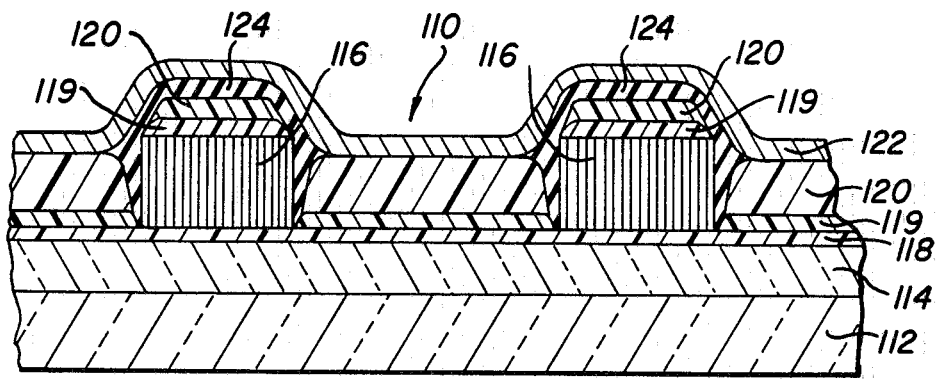
FIG. 2 is a cross-sectional view of a photovoltaic device in accordance with the present invention wherein a front contact current collector grid is disposed between two layers of semiconductor material, each having the same type conductivity.

FIG. 2 shows a cross-sectional view of a photovoltaic device in a preferred embodiment of the present invention. As can be seen, the photovoltaic device generally referred to by reference number 110 comprises a transparent substrate 112 through which radiant energy enters the photovoltaic device. An optically transparent electrically conductive material 114 is deposited on the substrate 112. Deposited onto the transparent conductive layer 114 is a continuous layer of a semiconductor material 118. Semiconductor material 118 and its thicknesses are selected so that layer 118 has a relatively low resistance. There is next disposed on semiconductor layer 118 a front contact current collector grid shown in FIG. 2 by the reference number 116. A second semiconductor layer 119 is deposited onto the current collector 116 and the exposed portions of first semiconductor layer 118. The second semiconductor 119 is of the same type conductivity as the first semiconductor layer 118, and preferably comprises the same material. The combined thickness of first and second semiconductor layers, 118 and 119 respectively, is about equal to the thickness of a single semiconductor layer of like conductivity type found in prior art photovoltaic devices such as layer 18 depicted in FIG. 1. By providing first semiconductor layer 118 continuously across the transparent conductive layer 114, and then forming the front contact current collector grid 116 thereon, any discontinuities or impurities incurred as a result of the formation or presence of front contact current collector grid 116 will not adversely affect the integrity of the transparent conductive layer 114.

Subsequent to the deposition of second semiconductor layer 119 there is deposited thereon a third semiconductor layer 120 having a conductivity type different than the conductivity type of the first and second semiconductor layers, 118 and 119. A layer of an insulating material 124 is deposited over the grid lines 116 so as to insure that the transparent conductive layer 114 and the front contact current collector grid 116 are not shorted to a back electrical contact 122. The back electrical contact 122 is shown deposited onto the third semiconductor layer 120 and the layer of insulating material 124 and forms an ohmic contact with the third semiconductor layer for efficient current collection therewith. The back electrical contact comprises a layer of a material selected from the group consisting of copper, nickel, gold, silver, and mixtures and alloys thereof.

For exemplary purposes, the photovoltaic device shown in FIG. 2 may comprise a glass substrate 112; a layer of indium tin oxide, 114; two layers of CdS, 118 and 119; a copper current collector grid 116 disposed between layers 118 and 119; a layer of CdTe 120; and a nickel back contact 122.

As is evident from a comparison of FIGS. 1 and 2, the present invention provides a front contact current collector grid and a photovoltaic device incorporating such a front contact current collector grid therein, as well as a method of making such a photovoltaic device, wherein the disadvantages of utilizing such a current collector grid in conjunction with known electrodeposition processes are avoided. The front contact current collector grid forms a low resistance stable contact with the first and second semiconductor layers, each layer of the same type conductivity. The subject invention avoids the potential for electrical insulation of the current collector grid and insures its electrical contact with active semiconductor layers and current collection therefrom.

EXAMPLES

Two photovoltaic devices were made to demonstrate the effectiveness of the present invention. It was attempted to prepare large area (approximately two centimeters by two centimeters) solar cells, similar to the photovoltaic devices depicted in FIGS. 1 and 2. The photovoltaic devices utilized a glass substrate coated on one side with a layer of indium tin oxide, an optically transparent electrically conductive material.

In the first photovoltaic device, prepared in accordance with FIG. 1, a current collector comprising evaporated copper strips was disposed onto the indium tin oxide layer. Onto the exposed indium tin oxide layer and current collector was electrodeposited a layer of cadmium sulfide, having a thickness of about 0.06 micrometer. This semiconductor layer was deposited in accordance with the method taught in U.S. Pat. No. 4,388,483. The cadmium sulfide layer was then heat treated at about 400° C. for about 10 minutes. A semiconductor layer of cadmium telluride was then attempted to be deposited onto the cadmium sulfide layer as taught in the above-referenced patent. In a matter of about five to fifteen minutes, cadmium telluride films deposited near the current collector strips became detached from the substrate. After about 30 minutes of plating cadmium telluride, there was seen to be a wide etched area, free of cadmium sulfide and cadmium telluride semiconductor material, around the periphery of the current collector strips. Upon closer inspection it was seen that the indium tin oxide layer had been eroded in this area. Thus, no photovoltaic device could be fabricated in this manner with a front contact current collector grid.

In a second photovoltaic device, an indium tin oxide coated glass substrate was immersed in a deposition bath and a layer of cadmium sulfide was electrodeposited thereon. The layer of cadmium sulfide had a thickness of about 0.03 micrometer. The cadmium sulfide layer was heat treated at about 400° C. for about 10 minutes. A front contact current collector grid comprising copper was then vapor deposited onto the thin cadmium sulfide layer. An alternative technique for depositing the current collector grid is electrodeposition. The cadmium sulfide surface was then etched in hydrazine and a second cadmium sulfide layer was electrodeposited thereon. The thickness of the second cadmium sulfide layer was about 0.03 micrometer. The photovoltaic device was then completed by depositing a layer of cadmium telluride having a thickness of about 1.2 micrometers and depositing a back electrical contact of nickel onto the cadmium telluride layer.

As is evident from these two examples, the incorporation of a front contact current collector grid disposed between two active semiconductor layers of the same conductivity type avoids the stability problems that may arise when the current collector grid is deposited directly onto a transparent conductive material that is susceptible to deterioration in subsequent processing steps. The disposition of the current collector grid between the two active semiconductor layers does not detract from its effectiveness, but rather enhances the current collection ability of this current collector since there is no erosion of the transparent conductive layer.

Inasmuch as the present invention is subject to many variations, modifications and changes in detail, a number of which have been expressly stated herein, it is intended that all matter described throughout the specification and shown in the accompanying drawings be interpreted as illustrative and not in a limiting sense. It should thus be evident that a device constructed in accordance with the concepts of the present invention or a method for the making thereof, and reasonable equivalents thereto, will accomplish the objects of the present invention. The scope of the invention shall include all modifications and variations that fall within the scope of the attached claims.

We claim:

1. A photovoltaic device comprising a first semiconductor layer of one conductivity type, a second semiconductor layer having the same type conductivity type as the first semiconductor layer, and a third semiconductor layer having a conductivity type opposite the conductivity type of the first and second semiconductor layers and forming a junction with the second layer, a front contact current collector grid being disposed between the first semiconductor layer and the second semiconductor layer.

2. The device in accordance with claim 1 wherein said grid comprises a material selected from the group consisting of copper, gold, silver, nickel, aluminum, indium, cadmium, tin, lead, zinc, and mixtures and alloys thereof.

3. The device in accordance with claim 1 wherein said grid comprises a material selected from the group consisting of copper, gold, silver, nickel, aluminum, and mixtures and alloys thereof.

4. The device in accordance with claim 1 wherein said grid comprises copper.

5. A photovoltaic device comprising an optically transparent substrate, a first semiconductor layer formed over the substrate, a current collector grid in ohmic contact with the first semiconductor layer and deposited thereon, a second semiconductor layer having the same conductivity type as the first semiconductor layer and deposited onto the exposed first semiconductor layer and current collector grid, a third semiconductor layer of opposite conductivity type from the first and second semiconductor layers and forming a junction with the second layer, and an electrically conductive film disposed on the third semiconductor layer to form an electrical contact therewith.

6. The photovoltaic device in accordance with claim 5 wherein a layer of an optically transparent electrically conductive material is disposed between said optically transparent substrate and said first semiconductor layer.

7. The photovoltaic device in accordance with claim 6 wherein said optically transparent electrically conductive layer comprises a transparent conductive oxide.

8. The photovoltaic device in accordance with claim 7 wherein said optically transparent, electrically conductive layer comprises indium tin oxide.

9. The photovoltaic device in accordance with claim 5 wherein said optically transparent substrate comprises glass.

10. The photovoltaic device in accordance with claim 5 wherein said first and second semiconductor layers comprise the same semiconductor material.

11. The photovoltaic device in accordance with claim 5 wherein said semiconductor layers comprise at least one of the metal elements of Group IIB of the Periodic Table of Elements and one of the non-metal elements of Group VIA of the Periodic Table of Elements.

12. The photovoltaic device in accordance with claim 5 wherein said first and second semiconductor layers comprise cadmium sulfide and said third semiconductor layer comprises cadmium telluride.

13. The photovoltaic device in accordance with claim 5 wherein said first and second semiconductor layers comprise cadmium sulfide and said third semiconductor layer comprises mercury cadmium telluride.

14. The photovoltaic device in accordance with claim 5 wherein the ratio of thicknesses between the first and second semiconductor layers ranges from about 1:9 to about 9:1.

15. The photovoltaic device in accordance with claim 5 wherein the ratio of thicknesses between the first and second semiconductor layers ranges from about 2:3 to about 3:2.

16. The photovoltaic device in accordance with claim 5 wherein the ratio of thicknesses between the first semiconductor layer and the second semiconductor layer is about 1:1.

17. The photovoltaic device in accordance with claim 5 wherein said grid comprises a material selected from the group consisting of copper, gold, silver, nickel, aluminum, indium, cadmium, tin, lead, zinc, and mixtures and alloys thereof.

18. The photovoltaic device in accordance with claim 5 wherein said grid comprises a material selected from the group consisting of copper, gold, silver, nickel, aluminum, and mixtures and alloys thereof.

19. The photovoltaic device in accordance with claim 5 wherein said grid comprises copper.

20. The photovoltaic device in accordance with claim 5 wherein said electrically conductive film disposed on the third semiconductor layer comprises a material selected from the group consisting of copper, nickel, gold, silver, and mixtures and alloys thereof.

21. The photovoltaic device in accordance with claim 5 wherein said electrically conductive film disposed on the third semiconductor layer comprises nickel.

22. A process for forming a photovoltaic device, which process comprises:
(a) depositing a first semiconductor layer onto an optically transparent substrate;
(b) selectively depositing an electrically conductive material onto said first semiconductor layer to form a current collector grid thereon;
(c) depositing a second semiconductor layer having the same conductivity type as said first semiconductor layer on said exposed first semiconductor layer and said current collector grid;
(d) depositing a third semiconductor layer having a conductivity type opposite from the conductivity type of said first and second semiconductor layers onto said second semiconductor layer; and
(e) depositing an electrically conductive material onto said third semiconductor layer so as to form an electrical contact therewith.

23. The method in accordance with claim 22 wherein prior to step (a) an optically transparent electrically conductive layer is deposited on said optically transparent substrate.

24. The method in accordance with claim 23 wherein said substrate is glass, said optically transparent electrically conductive layer is indium tin oxide, said first and second semiconductor layers are cadmium sulfide, said current collector grid is copper, said third semiconductor layer is cadmium telluride and said electrically conductive material deposited onto the third semiconductor layer is nickel.

25. The method in accordance with claim 23 wherein said substrate is glass, said optically transparent electrically conductive layer is indium tin oxide, said first and second semiconductor layers are cadmium sulfide, said current collector grid is copper, said third semiconductor layer is mercury cadmium telluride and said electrically conductive material deposited onto the third semiconductor layer is nickel.

26. The method in accordance with claim 22 wherein prior to step (e) an electrically insulating material is deposited onto said current collector grid.

27. The method in accordance with claim 22 wherein said semiconductor layers are deposited by electrodeposition techniques.

28. The method in accordance with claim 22 wherein said electrically conductive material that forms said current collector grid is deposited by vapor deposition techniques.

29. The method in accordance with claim 22 wherein said electrically conductive material that forms said current collector grid is deposited by electrodeposition techniques.

* * * * *